(12) United States Patent
Issavi

(10) Patent No.: US 12,261,018 B2
(45) Date of Patent: Mar. 25, 2025

(54) PLENUM ASSEMBLIES FOR COOLING TRANSFORMER COUPLED PLASMA WINDOWS

(71) Applicant: LAM RESEARCH CORPORATION, Fremont, CA (US)

(72) Inventor: Hanry Issavi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 191 days.

(21) Appl. No.: 17/795,356

(22) PCT Filed: Jan. 22, 2021

(86) PCT No.: PCT/US2021/014505
§ 371 (c)(1),
(2) Date: Jul. 26, 2022

(87) PCT Pub. No.: WO2021/154590
PCT Pub. Date: Aug. 5, 2021

(65) Prior Publication Data
US 2023/0065203 A1  Mar. 2, 2023

Related U.S. Application Data

(60) Provisional application No. 62/968,305, filed on Jan. 31, 2020.

(51) Int. Cl.
*H01J 37/32* (2006.01)
(52) U.S. Cl.
CPC ... *H01J 37/32119* (2013.01); *H01J 37/32522* (2013.01); *H01J 2237/002* (2013.01)

(58) Field of Classification Search
CPC ...... H01J 37/32; H01J 37/321; H01J 37/3211; H01J 37/32119; H01J 37/32522; H01J 2237/002
See application file for complete search history.

(56) References Cited

U.S. PATENT DOCUMENTS

| | | |
|---|---|---|
| 8,608,903 B2 | 12/2013 | Yamazawa et al. |
| 8,741,097 B2 | 6/2014 | Yamazawa et al. |

(Continued)

FOREIGN PATENT DOCUMENTS

| | | |
|---|---|---|
| JP | 2011119657 A | 6/2011 |
| JP | 2015531163 A | 10/2015 |

(Continued)

OTHER PUBLICATIONS

International Search Report and Written Opinion of the ISA issued in PCT/US2021/014505, mailed May 17, 2021; ISA/KR.

(Continued)

*Primary Examiner* — Thai Pham

(57) ABSTRACT

A plenum for a dielectric window of a substrate processing system includes a first inlet port, a second inlet port, and a body. The body includes: a first recessed area configured to hold a first coil; a second recessed area configured to hold a second coil; a third recessed area configured to oppose a first area of the dielectric window, receive a first coolant from the first inlet port, and direct the first coolant across the first area to cool a first portion of the dielectric window; and a fourth recessed area configured to oppose a second area of the dielectric window, receive a second coolant from the second inlet port, and direct the second coolant across the second area to cool a second portion of the dielectric window.

21 Claims, 13 Drawing Sheets

(56) References Cited

U.S. PATENT DOCUMENTS

| | | | |
|---|---|---|---|
| 10,804,076 B2 | 10/2020 | Yamazawa et al. | |
| 2013/0087283 A1* | 4/2013 | McChesney | H01J 37/32238 |
| | | | 156/345.37 |
| 2014/0020835 A1 | 1/2014 | Nguyen et al. | |
| 2017/0032931 A1* | 2/2017 | Kamp | H01J 37/3244 |
| 2017/0103875 A1* | 4/2017 | McChesney | H01J 37/32238 |
| 2018/0156489 A1* | 6/2018 | Sriraman | H01J 37/32522 |
| 2019/0148118 A1 | 5/2019 | Zhang et al. | |

FOREIGN PATENT DOCUMENTS

| | | |
|---|---|---|
| JP | 2021503183 A | 2/2021 |
| KR | 1020170038182 A | 4/2017 |

OTHER PUBLICATIONS

Office Action issued in Corresponding Japanese Patent App. No. 2022546345 mailed on Jul. 16, 2024.

* cited by examiner

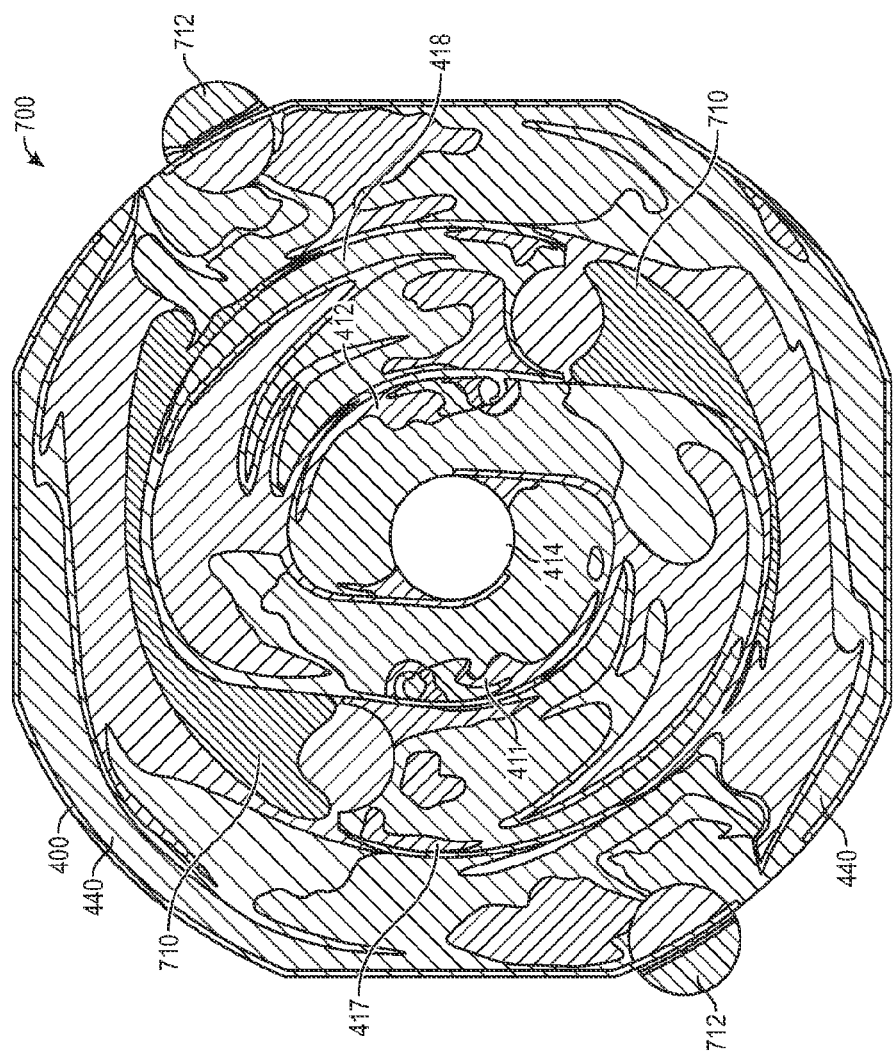
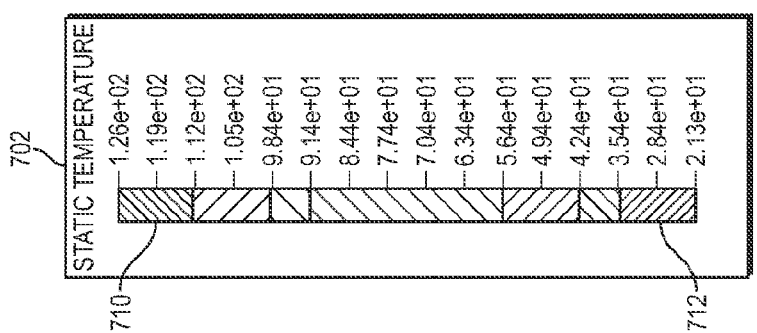
FIG. 7

PLENUM ASSEMBLIES FOR COOLING TRANSFORMER COUPLED PLASMA WINDOWS

CROSS-REFERENCE TO RELATED APPLICATIONS

This application is a U.S. National Phase Application under 35 U.S.C. 371 of International Application No. PCT/US2021/014505, filed on Jan. 22, 2021, which claims the benefit of U.S. Provisional Application No. 62/968,305, filed on Jan. 31, 2020. The entire disclosures of the applications referenced above are incorporated herein by reference.

FIELD

The present disclosure relates to cooling transformer coupled plasma windows.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During manufacturing of semiconductor devices, etch processes and deposition processes may be performed within a processing chamber. Ionized gas, or plasma, can be introduced into the plasma chamber to etch (or remove) material from a substrate such as a semiconductor wafer, and to sputter or deposit material onto the substrate. Creating plasma for use in manufacturing or fabrication processes typically begins by introducing process gases into the processing chamber. The substrate is disposed in the processing chamber on a substrate support such as an electrostatic chuck or a pedestal.

The processing chamber may include transformer coupled plasma (TCP) reactor coils. A radio frequency (RF) signal, generated by a power source, is supplied to the TCP reactor coils. The TCP reactor coils are driven by a transformer coupled capacitive tuning (TCCT) match network. The TCCT match network receives the RF signal supplied by the power source and enables tuning of power provided to the TCP reactor coils. A dielectric window, constructed of a material such as ceramic, is incorporated into an upper surface of the processing chamber. The dielectric window allows the RF signal to be transmitted from the TCP reactor coils into the interior of the processing chamber. The RF signal excites gas molecules within the processing chamber to generate plasma.

SUMMARY

A plenum for a dielectric window of a substrate processing system is provided. The plenum includes a first inlet port, a second inlet port, and a body including: a first recessed area configured to hold a first coil; a second recessed area configured to hold a second coil; a third recessed area configured to oppose a first area of the dielectric window, receive a first coolant from the first inlet port, and direct the first coolant across the first area to cool a first portion of the dielectric window; and a fourth recessed area configured to oppose a second area of the dielectric window, receive a second coolant from the second inlet port, and direct the second coolant across the second area to cool a second portion of the dielectric window.

In other features, the body includes a fifth recessed area configured to oppose a third area of the dielectric window, receive the first coolant from the third recessed area, and direct the first coolant across the third area to cool a third portion of the dielectric window. In other features, the plenum further includes a backup passage disposed in the fifth recessed area and receiving a third coolant. In other features, the third coolant is compressed dry air.

In other features, the third recessed area is circular shaped and directs the first coolant towards a centrally located output of the plenum. The fourth recessed area is circular shaped and directs the second coolant to an output along a periphery of the plenum.

In other features, the first recessed area and the second recessed area are on a top side of the plenum. The third recessed area and the fourth recessed area are on a bottom side of the plenum. In other features, the second recessed area, the third recessed area, and the fourth recessed area are respective channels.

In other features, the body is circular shaped. In other features, the body is shaped and sized to match an outer periphery of the dielectric window. In other features, the body the body includes a backup passage for cooling at least one of the third recessed area or a fifth recessed area.

In other features, the third recessed area includes radially extending guides for guiding the first coolant from the first inlet port to a centrally located output. In other features, the third recessed area includes annularly extending guides for directing the first coolant in an annular direction.

In other features, the third recessed area includes at least one of a divider or a radially extending guide. The annularly extending guides and the at least one of the divider or the radially extending guide direct the first coolant from the first inlet port to a centrally located output.

In other features, a system is provided and includes: the plenum; and at least one coolant source supplying the first coolant to the first inlet port and the second coolant to the second inlet port. In other features, the first coolant is different than the second coolant. In other features, the first coolant is at least one of at a different flow rate or at a different pressure than the second coolant. In other features, the first coolant is compressed dry air and the second coolant is air at atmospheric pressure.

In other features, a system is provided and includes: the plenum; the dielectric window; and at least one of a valve or a mass flow controller configured to adjust at least one of a flow rate or a pressure of the first coolant and at least one of a flow rate or a pressure of the second coolant.

In other features, a system is provided and includes: the plenum; and the dielectric window. The third recessed area forms a first channel with the dielectric window. The fourth recessed area forms a second channel with the dielectric window.

In other features, the system further includes: a temperature sensor detecting a temperature of the dielectric window or a temperature of the plenum; and a controller configured to, based on an output of the temperature sensor, adjust at least one of a flow rate of the first coolant or a flow rate of the second coolant.

In other features, a plenum for a transformer coupled plasma window is provided. The plenum includes: a first inlet port; a second inlet port; a backup port; and a body including a circular recessed area, a first channel, a second channel, a third channel, and a fourth channel. The circular recessed area is configured to hold a first coil. The first channel is configured to hold a second coil. The second channel is on an opposite side of the body than the circular recessed area and the first channel. The second channel is configured to oppose a first area of the dielectric window, receive a first coolant from the first inlet port, and direct the first coolant across the first area to cool a first portion of the dielectric window. The third channel is disposed radially inward of the second channel and on an opposite side of the body than the circular recessed area and the first channel. The third channel is configured to oppose a second area of the dielectric window, receive a second coolant from the second inlet port, and direct the second coolant across the second area to cool a second portion of the dielectric window. The fourth channel is disposed radially inward of the third channel and on an opposite side of the body than the circular recessed area and the first channel. The fourth channel is configured to oppose a third area of the dielectric window, receive a third coolant from the backup port, and direct the third coolant across the third area to cool a third portion of the dielectric window. In other features, the third channel is deeper than the fourth channel and directs the second coolant into the fourth channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 7 is a thermal diagram illustrating example air temperatures above a corresponding dielectric window and below the plenum of FIG. 4;

In the drawings, reference numbers may be reused to identify similar and/or identical elements.

DETAILED DESCRIPTION

A plenum assembly may be incorporated on a TCP window and used to cool a TCP window. A coolant (e.g., a cooling gas) is passed, via the plenum assembly, over and cools the TCP window. The plenum assembly may include a plenum having a cooling zone through which the coolant passes. The plenum is disposed between TCP reactor coils and the TCP window. A plenum having a single cooling zone can experience overheating at or near a center and/or an outer circumferential edge of the plenum during, for example, center hot and edge hot processes. This overheating can limit the amount of processing power supplied to, for example, the TCP reactor coils. As a result, process power is limited to prevent thermal stresses and/or cracking in the TCP window.

The examples set forth herein include plenums having zonal structures for improved and efficient cooling of TCP windows. The plenums have different structural patterns and different corresponding coolant flow patterns. The plenums allow for increased processing power and improved overall system performance. The plenums provide a broadband solution to cooling TCP windows and expand etch tool capability to run at higher power levels and prevent TCP window cracking by minimizing temperature gradients across the TCP windows. The plenums cover a large spectrum of process power while being applicable to different TCP reactor coils and edge hot and center hot processes. The plenums are applicable to various different etching tools having TCP windows and are capable of being used in various different plasma processes. The plenums also allow for improved temperature control while aiding in preventing overheating and overcooling.

In some examples, the plenums cool the entire corresponding TCP windows and cover the overall upper surface areas of the TCP windows. Each of the plenums includes multiple zones (e.g., two or more distinct cooling zones), which may include a backup zone. As an example, the azimuthal temperature uniformity provided by the plenums may be ±5° C. and the power capacity of the corresponding tool may be 6 kilo-watts (kW). The azimuthal temperature uniformity refers to the maximum differences in temperatures across a TCP window at any moment during processing. The larger the variation in temperature across the TCP window, the more thermal stress on the TCP window. By minimizing the maximum differences in temperatures across a TCP window, processing power can be increased. The addition of a backup cooling zone provides additional cooling capacity, which further allows for increased processing power. The backup cooling zones aid in preventing TCP windows from exceeding 150° C. This prevents damage to the TCP window. As an example, coating delamination of a TCP window can occur at temperatures greater than or equal to 150° C.

Figure 1:
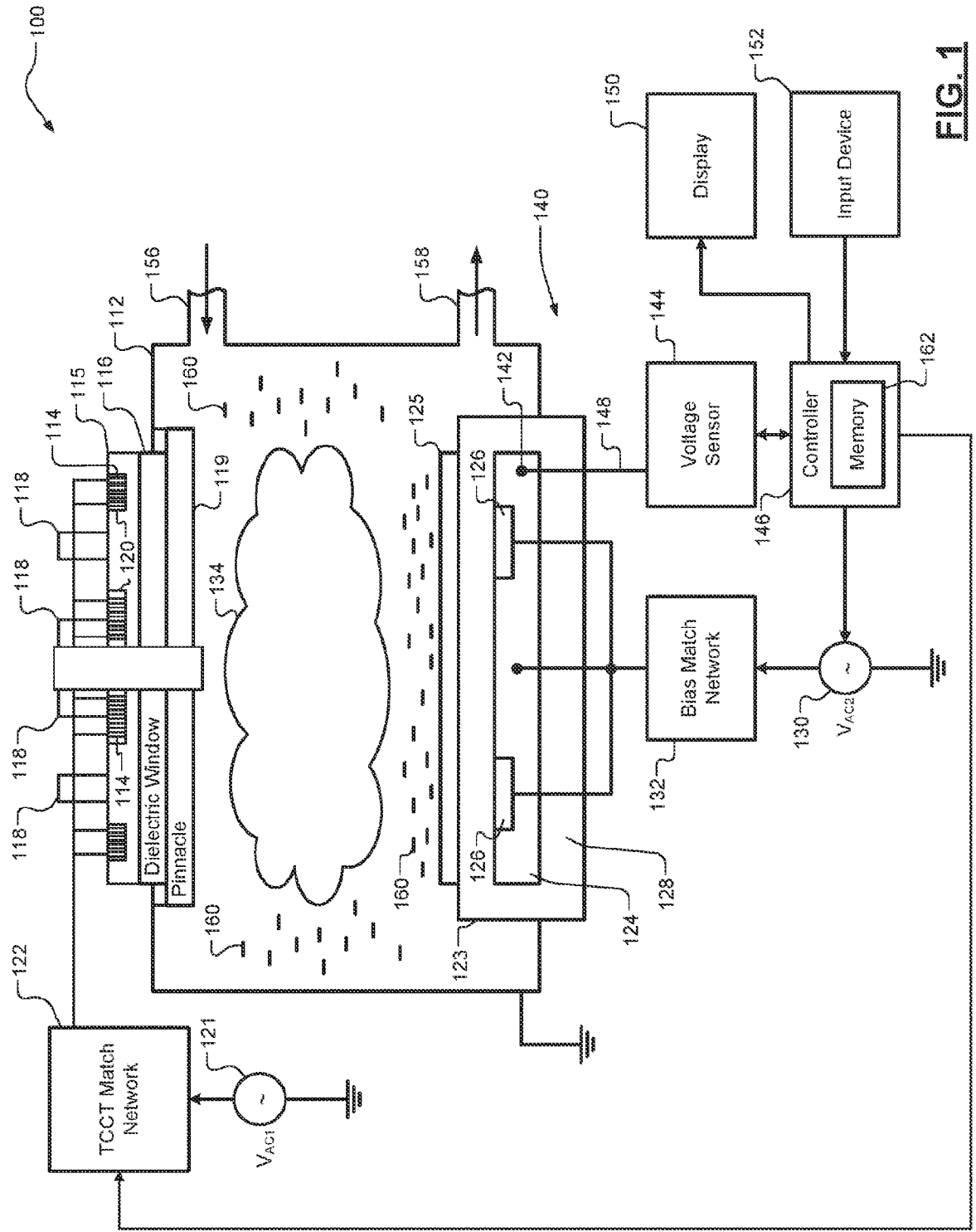
FIG. 1 is a functional block diagram of an example of a first portion of a plasma processing system incorporating a plenum cooling system having a plenum in accordance with the present disclosure.
Figure 2:
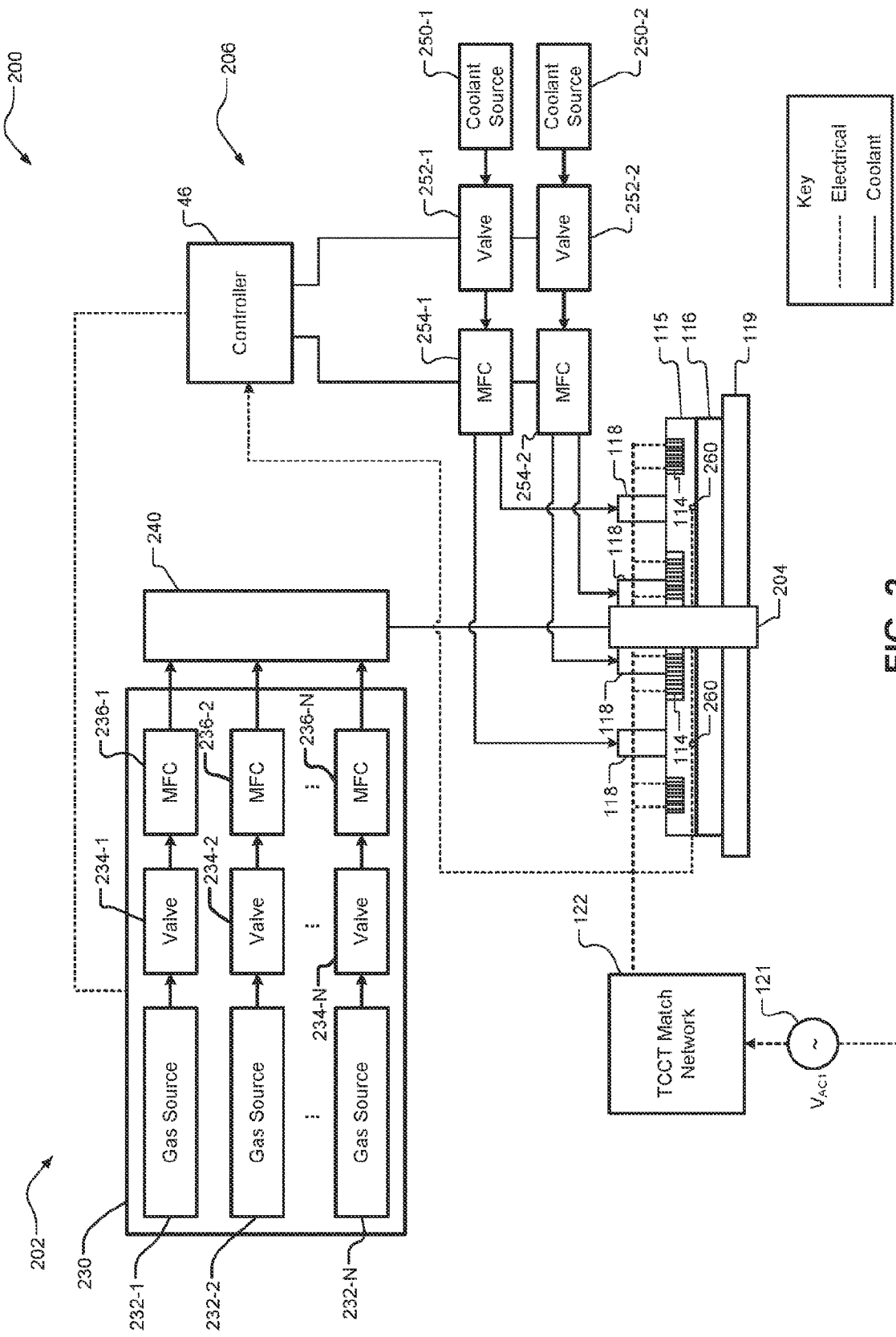
FIG. 2 is a functional block diagram of an example of a second portion of the plasma processing system of FIG. 1 illustrating a gas delivery system and a coolant supply system for the plenum.

FIG. 1 shows a first portion 100 of a plasma processing system that includes a plenum cooling system, a plasma processing chamber 112 and TCP reactor coils 114. A portion of the plenum cooling system is shown in FIG. 1. An example remainder portion of the plasma cooling system is shown in FIG. 2. The plenum cooling system includes a plenum 115 that is disposed between the TCP reactor coils 114 and a dielectric (or TCP) window 116. The plenum 115 receives a coolant via inlet lines 118 (e.g., pipes). The coolant is circulated and/or passed between portions of the plenum 115 and the dielectric window 116. The plenum 115 and the other plenums disclosed herein may be formed of, for example, polyphensulfane (PPSU), polyetheretherketone (PEEK), polyamide-imide, polyimide-based plastic, and/or polytetrafluoroethylene (PTFE) and/or other material having appropriate electrical properties and meeting dielectric dissipation factor, loss tangent, and dielectric constant requirements. In one embodiment, one or more of the plenums are injection molded. The plenums are easy to access and install and for at least this reason are easy to maintain. Examples of the plenum are shown in FIGS. 3-5 and 8-16.

The plenum 115 may include multiple circular-shaped recessed areas (or channels) 120 in which the TCP reactor coils 114 (e.g., an inner coil and an outer coil) are disposed. The TCP reactor coils 114 are disposed above at least a portion of the plenum 115. A first power source 121 provides a first RF source signal to a TCCT match network 122. The TCCT (or first) match network 122 is included between the first power source 121 and the TCP reactor coils 114. The TCCT match network 122 enables tuning of power provided to the TCP reactor coils 114.

The dielectric window 116 is located adjacent the plenum 115, above a pinnacle 119 and allows efficient transmission of the first RF source signal into the plasma processing chamber 112 for plasma generation purposes. A pinnacle may refer to an upper liner of a processing chamber and be configured to support a dielectric window. A substrate support 123 such as an electrostatic chuck, a pedestal or other suitable substrate support is disposed at the bottom of the plasma processing chamber 112. The substrate support 123 supports a substrate 125. If the substrate support 123 is an electrostatic chuck, the substrate support 123 includes electrically conductive portions 124 and 126, which are electrically isolated from each other. The substrate support 123 is surrounded by an insulator 128 and is capacitively coupled to the substrate 125. By applying a DC voltage across the conductive portions 124, 126, an electrostatic coupling is created between the conductive portions 124, 126 and the substrate 125. This electrostatic coupling attracts the substrate 125 against the substrate support 123.

The plasma processing system further includes a bias RF power source 130, which is connected to a bias (or second) match network 132. The second match network 132 is connected between the bias RF power source 130 and the substrate support 123. The second match network 132 matches an impedance (e.g., 500) of the bias RF power source 130 to an impedance of the substrate support 123 and plasma 134 in the plasma processing chamber 112 as seen by the second matching network 132.

The plasma processing system further includes a voltage control interface (VCI) 140. The VCI 40 may include a pickup device 142, a voltage sensor 144, a controller 146 and circuits between the voltage sensor 144 and the controller 146. The pickup device 142 extends into the substrate support 123. This pickup device 142 is connected via a conductor 148 to the voltage sensor 144 and is used to generate a RF voltage signal.

Operation of the voltage sensor 144 may be monitored, manually controlled, and/or controlled via the controller 146. The controller 146 may display output voltages of the channels of the voltage sensor 144 on a display 150. Although shown separate from the controller 146, the display 150 may be included in the controller 146. A system operator may provide input signals indicating (i) whether to switch between the channels, (ii) which one or more of the channels to activate, and/or (ii) which one or more of the channels to deactivate.

In operation, a gas capable of ionization flows into the plasma processing chamber 112 through the gas inlet 156 and exits the plasma processing chamber 112 through the gas outlet 158. The first RF signal is generated by the RF power source 121 and is delivered to the TCP reactor coils 114. The first RF signal radiates from the TCP reactor coils 114 through the dielectric window 116 and into the plasma processing chamber 112. This causes the gas within the plasma processing chamber 112 to ionize and form the plasma 134. The plasma 134 produces a sheath 160 along walls of the plasma processing chamber 112. The plasma 134 includes electrons and positively charged ions. The electrons, being much lighter than the positively charged ions, tend to migrate more readily, generating DC bias voltages and DC sheath potentials at inner surfaces of the plasma processing chamber 112. An average DC bias voltage and a DC sheath potential at the substrate 125 affects the energy with which the positively charged ions strike the substrate 125. This energy affects processing characteristics such as rates at which etching or deposition occurs.

The controller 146 may adjust the bias RF signal generated by the RF power source 130 to change the amount of DC bias and/or a DC sheath potential at the substrate 125. The controller 146 may compare outputs of the channels of the voltage sensor 144 and/or a representative value derived based on the outputs of the channels to one or more set point values. The set point values may be predetermined and stored in a memory 162 of the controller 146. The bias RF signal may be adjusted based on differences between (i) the outputs of the voltage sensor 144 and/or the representative value and (ii) the one more set point values. The bias RF signal passes through the second match network 132. An output provided by the second match network 132 (referred to as a matched signal) is then passed to the substrate support 123. The bias RF signal is passed to the substrate 125 through the insulator 128.

FIG. 2 shows a second portion 200 of the plasma processing system, which includes a gas delivery system 202 for a gas injector 204 and a coolant supply system 206 for the plenum 115. The TCP reactor coils 114 are disposed in channels of the plenum 115 and receive an RF signal from the power source 121 via the TCCT match network 122.

The gas delivery system 202 includes the controller 46 and a gas delivery assembly 230 including one or more gas sources 232-1, 232-2, . . . , and 232-N (collectively gas sources 232), where N is an integer greater than zero. The gas sources 232 supply one or more gases (e.g., etch gas, carrier gases, purge gases, etc.) and mixtures thereof. The gas sources 232 may also supply purge gas. The gas sources 232 are connected by valves 234-1, 234-2, . . . , and 234-N (collectively valves 234) and mass flow controllers 236-1, 236-2, . . . , and 236-N (collectively mass flow controllers 236) to a manifold 240. An output of the manifold 240 is fed to the plasma processing chamber 112 of FIG. 1. For example only, the output of the manifold 240 injector 204. The controller 46 may control operation of the valves 234 and the mass flow controllers 236.

The coolant supply system 206 includes the controller 46, two or more coolant sources (coolant sources 250-1 and 250-2 are shown), two or more valves (valves 252-1 and 252-2 are shown), and two or more mass flow controllers (mass flow controllers 254-1 and 254-2 are shown). The controller 46 controls operation of the valves 252 and the mass flow controllers 254. A coolant is supplied from the coolant sources 250 to the inlet lines 118 via the valves 252 and mass flow controllers 254. Although two coolant sources, two valves, and two mass flow controllers are shown, additional coolant sources, valves for two cooling zones, additional coolant sources, mass flow controllers and valves may be included. In one embodiment, two cooling zones and a centrally located backup cooling zone are implemented with respective coolant sources, valves and mass flow controllers.

As an example, a source set including a coolant source, a valve, and a mass flow controller may be provided for each inlet port and/or backup passage of the below described plenums. In one embodiment, a source set including a coolant source, a valve, and a mass flow controller is provided for each pair of inlet ports and/or pair of backup passages. For example, a first source set is provided for a middle recessed area, a second source set is provided for outer recessed areas, and a third source set is provided for a pair of backup passages feeding a central recessed area.

The controller 46 may provide cooling via the first and second source sets while operating in a first mode, and provide cooling via the first, second and third source sets while operating in a second mode. The second mode is used to provide additional cooling. The controller 46 may also adjust coolant flow rates while in the first and second modes based on temperatures of the dielectric window 116. The temperatures may be detected via temperature sensors 260. In one embodiment the temperature sensors are located over areas of the dielectric window that are predetermined to be the hottest areas of the dielectric window during processing. Any number of temperature sensors 260 may be included. One or more temperature sensors may be included for each cooling zone, channel, passage, recessed area, etc. The temperatures sensors may be mounted in or on the plenum 115 and/or on the dielectric window 116. The flow rates of the coolant for one or more areas of the plenum 115 may be adjusted based on one or more temperatures in the same one or more areas and/or one or more temperatures in one or more other areas of the plenum 115.

In one embodiment, source sets are configured to supply (i) compressed dry air to one or more central zones of the plenum 115, and (ii) air at atmospheric pressure to one or more middle zones and/or one or more outer zones of the plenum 115. Examples of central, middle and outer zones are shown in FIGS. 4-16. In one embodiment, the air provided to the one or more middle zones and/or the one or more outer zones is amplified air provided via one or more air amplifiers. One or more of the mass flow controllers may include an air amplifier. The air amplifiers increase the volume of air supplied within a period of time.

Figure 3:
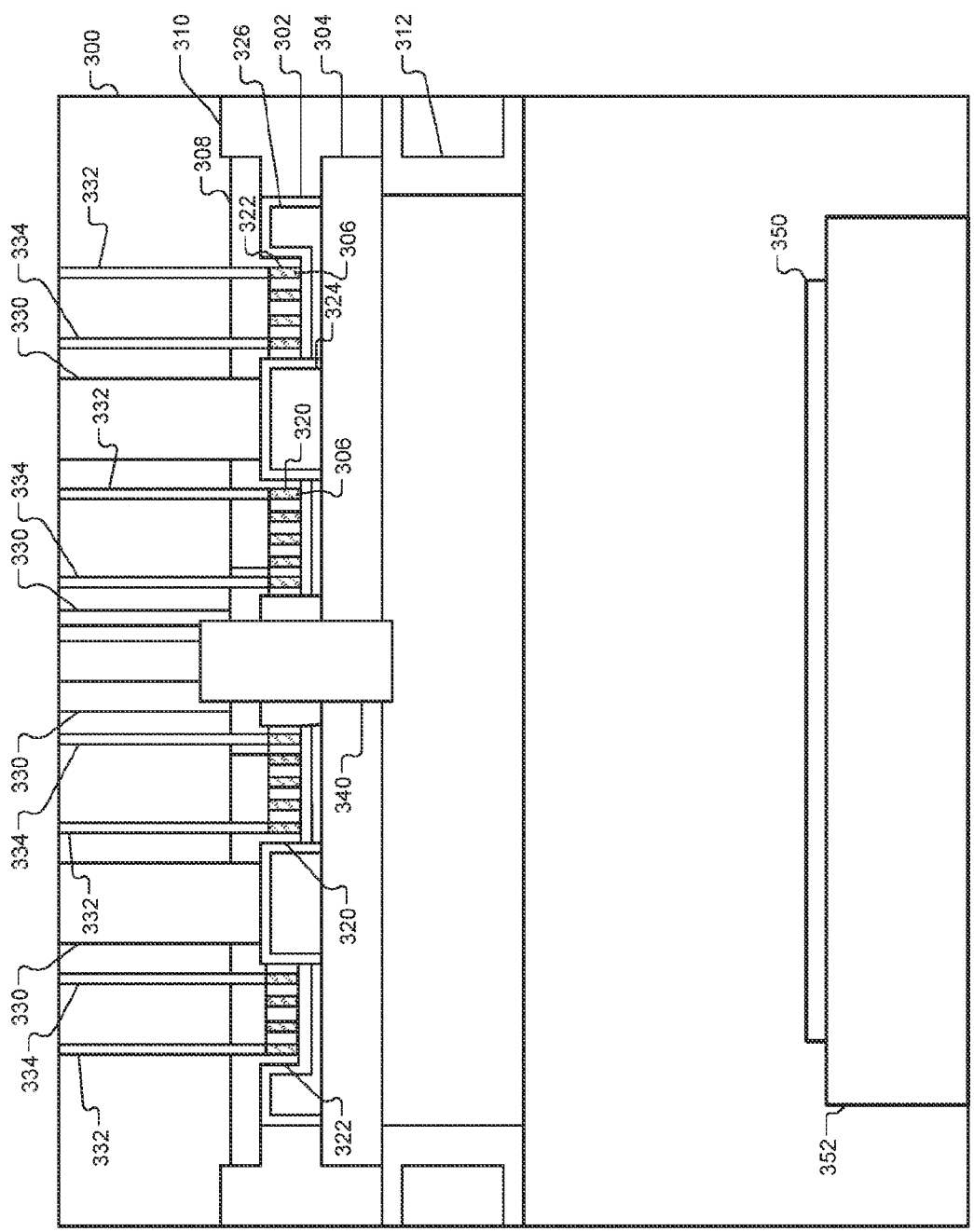
FIG. 3 is a cross-sectional view of a portion of a processing chamber including an example of a plenum in accordance with the present disclosure.

FIG. 3 shows a processing chamber 300 that includes a plenum 302 disposed between (i) a dielectric window 304 and (ii) TCP reactor coils 306 and an aligning member 308. The plenum 302 may be disposed within an outer ring 310, which is disposed on a pinnacle 312. The aligning member 308 aligns the plenum 302 on the dielectric window 304 and is disposed on an inner ledge of the outer ring 310. In the example shown, two TCP reactor coils 306 are shown and are disposed in an inner channel 320 and an outer channel 322 (referred to as coil channels) on a top side of the plenum 302. The plenum 302 also includes two lower (or coolant) channels 324, 326 for circulating and/or passing a coolant. The coolant may be supplied via passages (or pipes) 330 to the channels 324, 326. The plenum may include a third channel, which may be referred to as a center (or centermost) channel and/or backup channel. Examples of center and/or backup channels are shown in FIGS. 4-16.

The TCP reactor coils 306 may receive power via lines 332 and return power via lines 334. An injector 340 extends through the aligning member 308, the plenum 302 and the dielectric window 304 and may be secured onto the dielectric window 304. The injector 340 injects gas towards a substrate 350 disposed on a substrate support 352.

Figure 4:
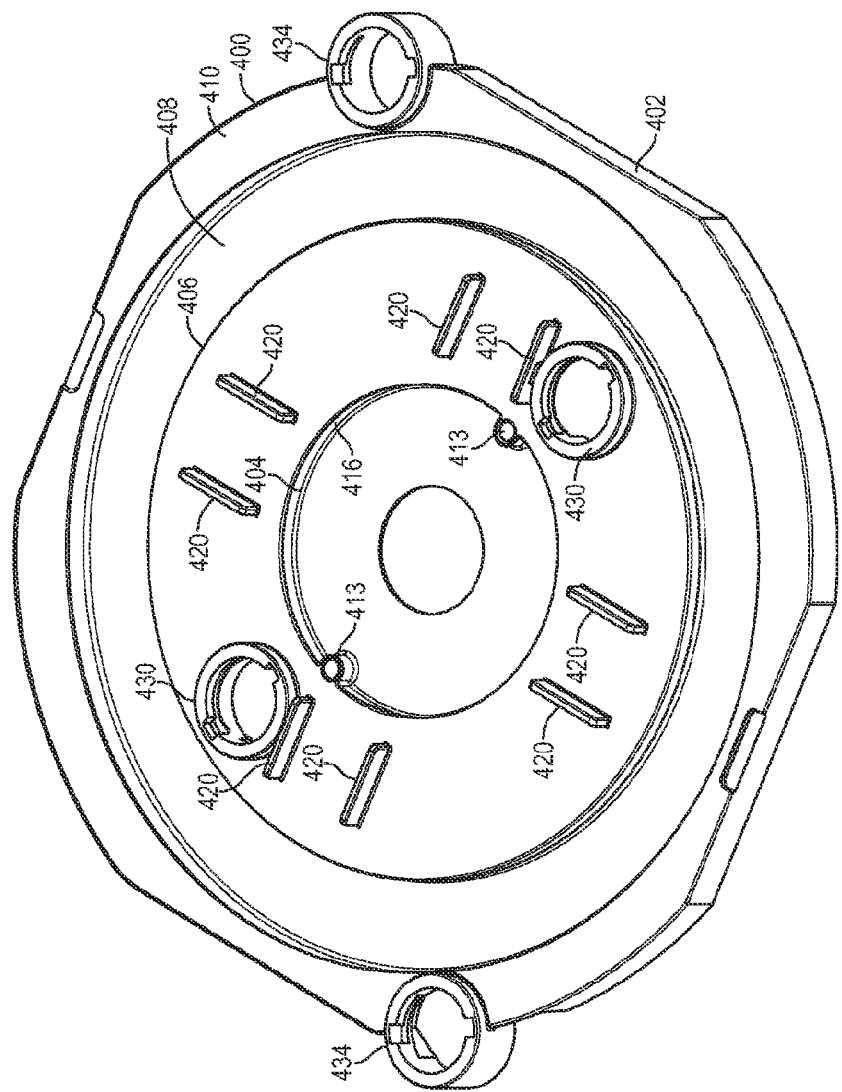
FIG. 4 is a top perspective view of another example plenum having a first zonal structure and corresponding first flow pattern in accordance with the present disclosure.
Figure 5:
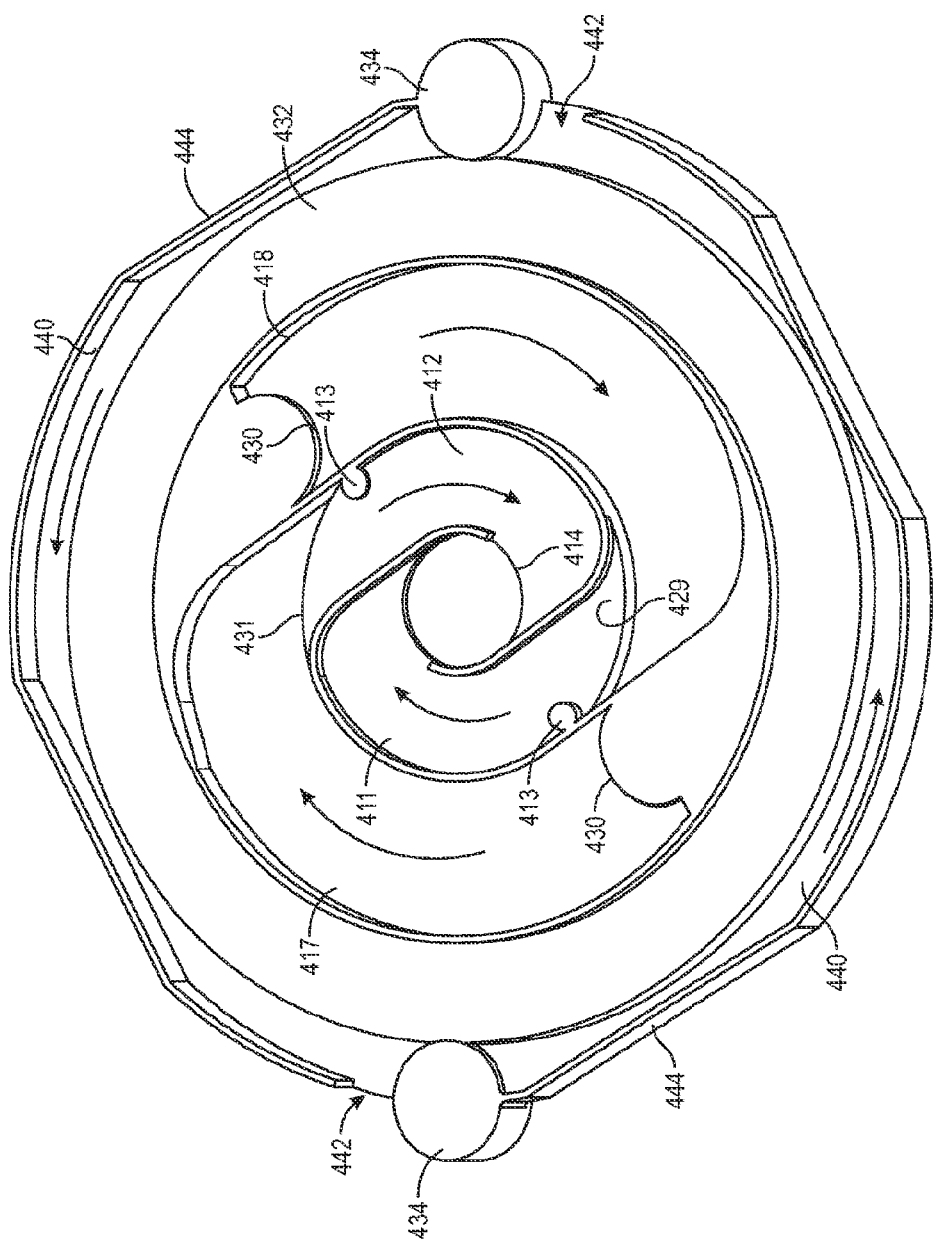
FIG. 5 is a bottom perspective view of the plenum of FIG. 4.
Figure 6:
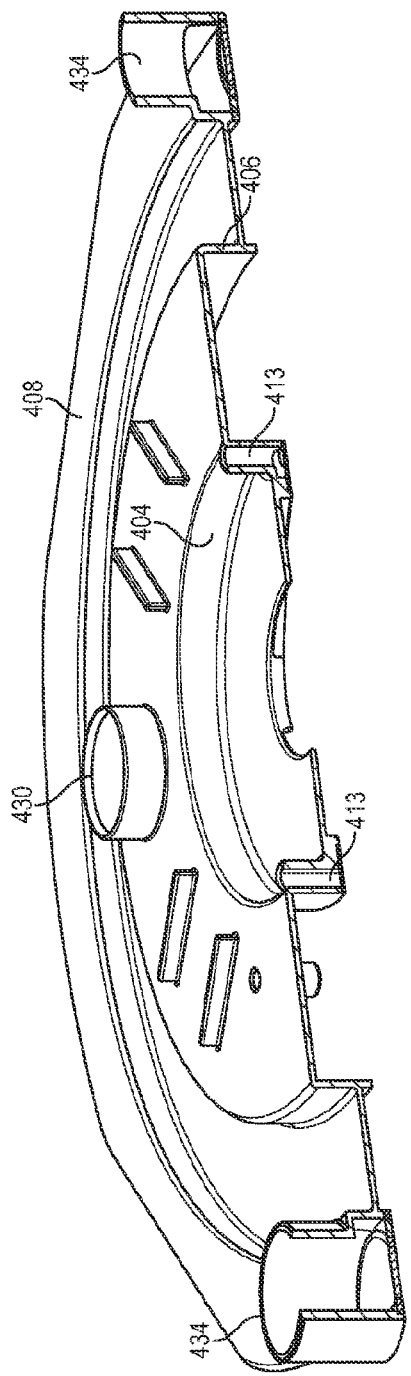
FIG. 6 is a cross-sectional cutaway perspective view of a portion of the plenum of FIG. 4.

FIGS. 4-6 show a plenum 400 having a first zonal structure and corresponding first flow pattern. The plenum 400 may replace one of the above-described plenums and includes a body 402 including a first central recessed area 404, a raised middle area 406, an outer channel 408, and a raised outer ledge 410. The first central recessed area 404 is configured for an inner TCP reactor coil and is over second and third central recessed areas 411, 412 that are located on a bottom side of the plenum 400. The plenum 400 may include backup passages 413 for supplying coolant to the second and third central recessed areas 411, 412. The backup passages 413 may be disposed along an outer sidewall edge 416 of the first central recessed area 404 on a top side of the plenum 400 and used to supply gas to the second and third central recessed areas 411, 412 on the bottom side of the plenum 400.

The raised middle area 406 may include guide pairs 420. Portions of an aligning member (e.g., the aligning member 308 of FIG. 3) are disposed between the guide pairs 420. The raised middle area 406 is an area between the inner TCP reactor coil disposed in the first central recessed area 404 and an outer TCP reactor coil disposed in the outer channel 408 and corresponds to middle recessed areas 417, 418 on the bottom side of the plenum 400. The raised middle area 406 includes two inlet ports 430. The inlet ports 430 are used to supply coolant to the middle recessed areas 417, 418. The middle recessed areas 417, 418 guide the coolant in a circular fashion towards inlets 429, 431 of the second and third central recessed areas 411, 412.

The second and third central recessed areas 411, 412 are used to direct coolant received from the ports 430 in a circular manner towards and out a central opening 414. The coolant may be released out the central opening 414 and in a gap between the inner edge of the plenum 400 and an injector (e.g., the injector 340 of FIG. 3). The injector is disposed in the central opening 414. Hence, the second and third central recessed areas 411, 412 and the middle recessed areas 417, 418 effectively perform as channels and have side walls for directing the coolant to corresponding areas to cool respective portions of a dielectric window (e.g., the dielectric window of FIG. 2) opposing the central recessed areas 411, 412 and the middle recessed areas 417, 418.

The outer channel 408 is configured to hold the outer TCP reactor coil and corresponds to an outer raised area 432 on the bottom side of the plenum 400. The raised outer ledge 410 includes two inlet ports 434, which supply coolant to outer channels 440 on the bottom side of the plenum 400. Coolant is supplied from the ports 434 to the outer channels 440 and output at openings 442 in outermost sidewalls 444 of the plenum 400. Hence, the outer channels 440 direct the coolant to corresponding areas to cool respective portions of a dielectric window (e.g., the dielectric window of FIG. 2) opposing the outer channels 440.

The structure of the plenum 400 causes coolant to flow in a certain pattern through passages formed by the plenum 400 and the corresponding dielectric window. Portions of the passages are provided by the recessed areas 411, 412, 417, 418 and outer channels 440 and opposing other portions of the passages are provided by a top surface of the corresponding dielectric window. In an embodiment, no seal is provided between the plenum 400 and the dielectric window. The coolant flows in a certain pattern across the dielectric window. The recessed areas 411, 412 are deeper than the recessed areas 417, 418. The outer channels (or recessed areas) 440 may have a same depth as the recessed areas 417, 418.

FIG. 7 shows a thermal diagram 700 illustrating example air temperatures above a corresponding dielectric window and below the plenum 400. The plenum 400 includes recessed areas 411, 412, 417, 418, the central opening 414 and the outer channels 440. A temperature bar key 702 is shown with the lowest temperature at the bottom of the temperature bar key 702 and the highest temperature at the top of the temperature bar key 702. The hottest areas are identified as 710 and the coolest areas are identified as 712.

Figure 8:
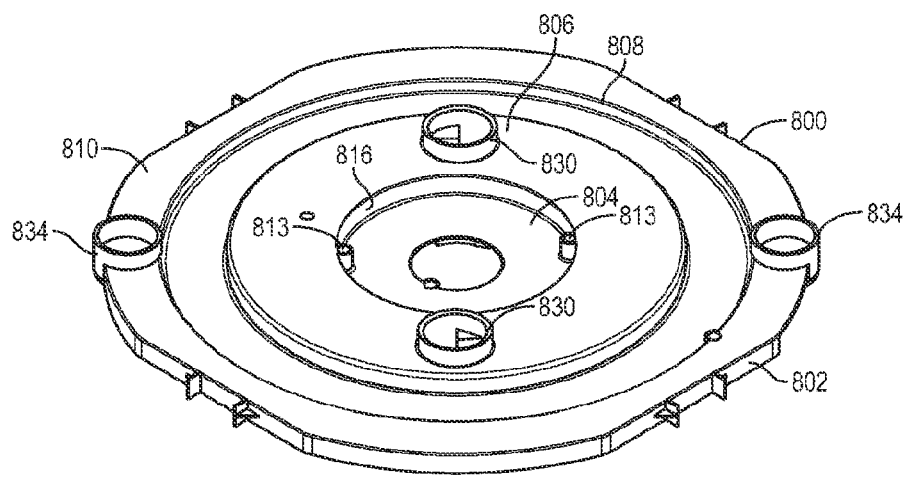
FIG. 8 is a top perspective view of another example plenum having a second zonal structure and corresponding second flow pattern in accordance with the present disclosure.
Figure 9:
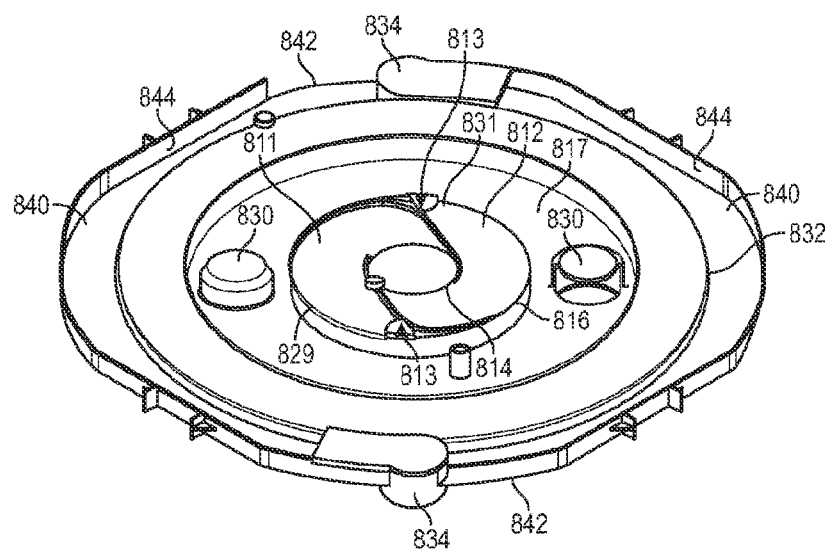
FIG. 9 is a bottom perspective view of the plenum of FIG. 8.

FIGS. 8-9 show a plenum 800 having a second zonal structure and corresponding second flow pattern. The plenum 800 may replace one of the above-described plenums and includes a body 802 including a first central recessed area 804, a raised middle area 806, an outer channel 808, and a raised outer ledge 810. The first central recessed area 804 is configured for an inner TCP reactor coil and is over second and third central recessed areas 811, 812 on a bottom side of the plenum 800. The plenum 800 may include backup passages 813 for supplying coolant to the second and third central recessed areas 811, 812. The backup passages 813 may be disposed along an edge of an outer sidewall 816 of the first central recessed area 804 on a top side of the plenum 800 and used to supply gas to the second and third central recessed areas 811, 812 on the bottom side of the plenum 800.

The raised middle area 806 is an area between the inner TCP reactor coil disposed in the first central recessed area 804 and an outer TCP reactor coil disposed in the outer channel 808 and corresponds to circular middle recessed area 817 on the bottom side of the plenum 800. The raised middle area 806 includes two inlet ports 830. The inlet ports 830 are used to supply coolant to the middle recessed area 817. The inlet ports 830 direct and the middle recessed area 817 guides the coolant in a circular fashion towards inlets 829, 831 of the second and third central recessed areas 811, 812.

The second and third central recessed areas 811, 812 are used to direct coolant received from the ports 830 in a circular manner towards and out a central opening 814. The coolant may be released out the central opening 814 and in a gap between the inner edge of the plenum 800 and an injector (e.g., the injector 340 of FIG. 3). The injector is disposed in the central opening 814. The second and third central recessed areas 811, 812 and the middle recessed area 817 are configured as channels and have side walls for directing the coolant to corresponding areas to cool respective portions of a dielectric window (e.g., the dielectric window of FIG. 2) opposing the second and third central recessed areas 811, 812 and the middle recessed area 817.

The outer channel 808 is configured to hold the outer TCP reactor coil and corresponds to an outer raised area 832 on the bottom side of the plenum 800. The raised outer ledge 810 includes two inlet ports 834, which supply coolant to outer channels 840 on the bottom side of the plenum 800. Coolant is supplied from the ports 834 to the outer channels 840 and output at openings 842 in outermost sidewalls 844 of the plenum 800. Hence, the outer channels 840 direct the coolant to corresponding areas to cool respective portions of a dielectric window (e.g., the dielectric window of FIG. 2) opposing the outer channels 840.

The structure of the plenum 800 causes coolant to flow in a certain pattern through passages formed by the plenum 800 and the corresponding dielectric window. Portions of the passages are provided by the recessed areas 811, 812, 817 and outer channels 840 and opposing other portions of the passages are provided by a top surface of the corresponding dielectric window. In an embodiment, no seal is provided between the plenum 800 and the dielectric window. The coolant flows in a certain pattern across the dielectric window.

The plenum 800 is similar to the plenum 400. The backup ports 813 are in different locations and shaped differently than the backup ports 413. The central recessed areas 811, 812 are shaped differently and have larger inlets than the central recessed areas 411, 412. The plenum 800 includes a single middle recessed area (or channel) 817 in which the inlet ports 830 are located, whereas the middle recessed areas 417, 418 of FIG. 5 extend from the ports 430.

Figure 10:
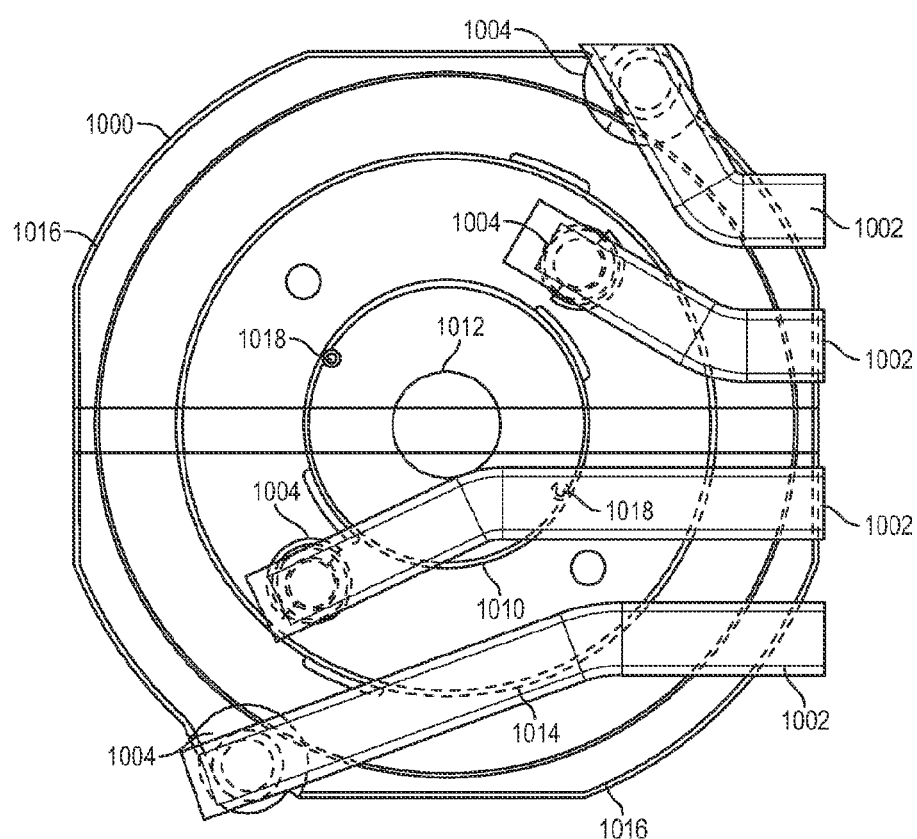
FIG. 10 is a top view of another example plenum illustrating example supply lines for corresponding cooling zones in accordance with the present disclosure.

FIG. 10 shows a plenum 1000 similar, but different structure than the plenums 400 and 800 of FIGS. 4 and 8. The plenum 1000 is provided as an example to illustrate coolant supply lines 1002 for corresponding cooling zones. The coolant supply lines 1002 supply coolant to the ports 1004. The plenums 400 and 800 of FIGS. 4 and 8 may have similar supply lines. The plenum 1000 includes a central recessed area 1010 with an output 1012, a middle channel 1014, and outer channels 1016. The central recessed area 1010 includes backup passages (or ports) 1018.

Figure 11:
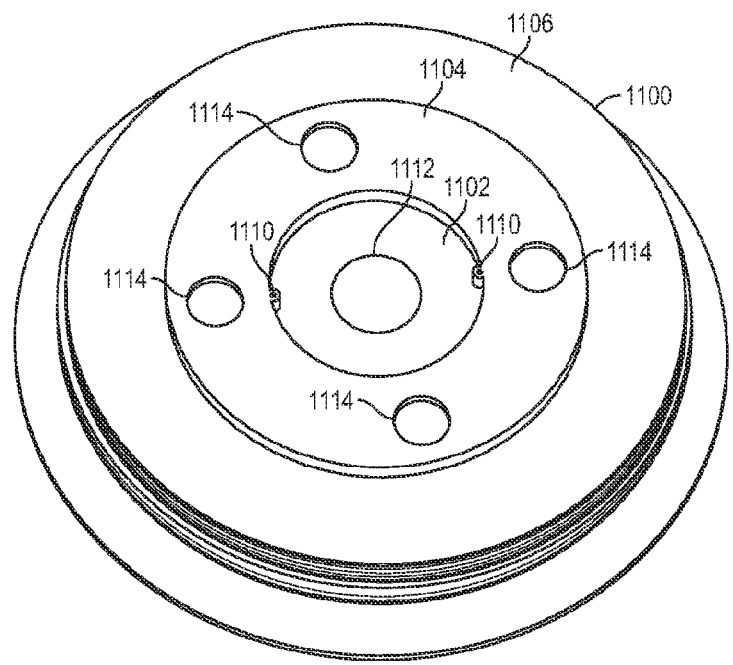
FIG. 11 is a top perspective view of another example plenum having a third zonal structure and corresponding third flow pattern in accordance with the present disclosure.
Figure 12:
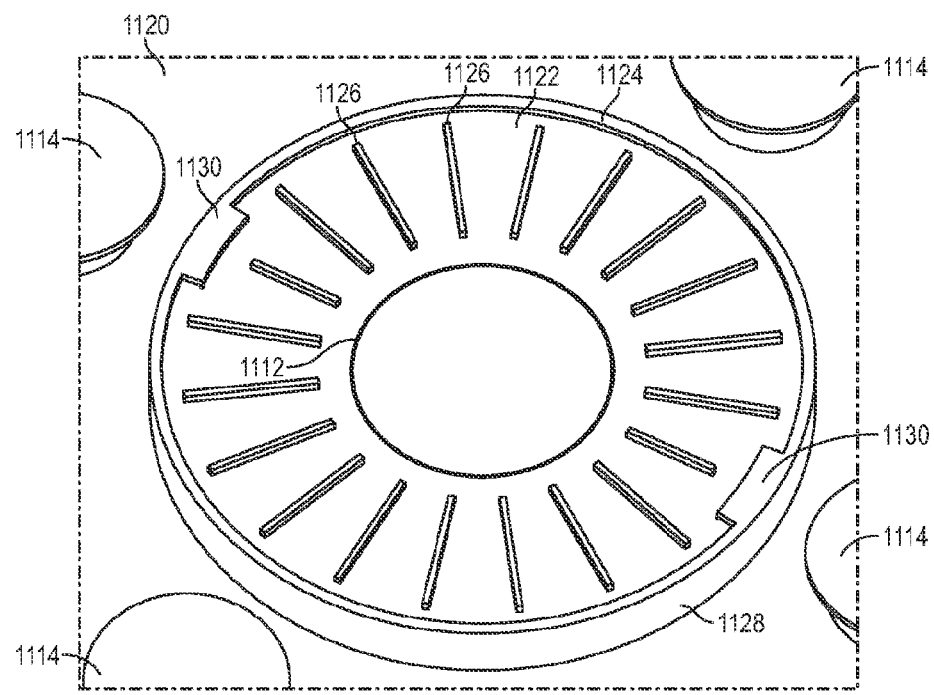
FIG. 12 is a bottom perspective view of the plenum of FIG. 11.

FIG. 11-12 show a plenum 1100 having a third zonal structure and corresponding third flow pattern. On a top side, the plenum 1100 includes a central recessed area 1102, a middle raised area 1104 and an outer recessed area 1106. The central recessed area 1102 and the outer recessed area 1106 are configured to hold TCP reactor coils. The central recessed area 1102 includes backup passages 1110 and an output 1112.

The middle raised area 1104 includes inlet ports 1114. The middle raised area 1104 provides a recessed area 1120 on a bottom side of the plenum 1100. On the opposite side of the central recessed area 1102 is a central recessed area 1122 having an outer circular edge 1124 and inner radially extending guides 1126. The outer circular edge 1124 is a bottom portion of a side wall 1128 of the central recessed area 1102. The backup passages 1110 have annularly extending output channels 1130 that extend circumferentially along an inner side of the outer circular edge 1124. The radially extending guides 1126 guide coolant received from the annularly extending output channels 1130 towards the output 1112.

Figure 13:
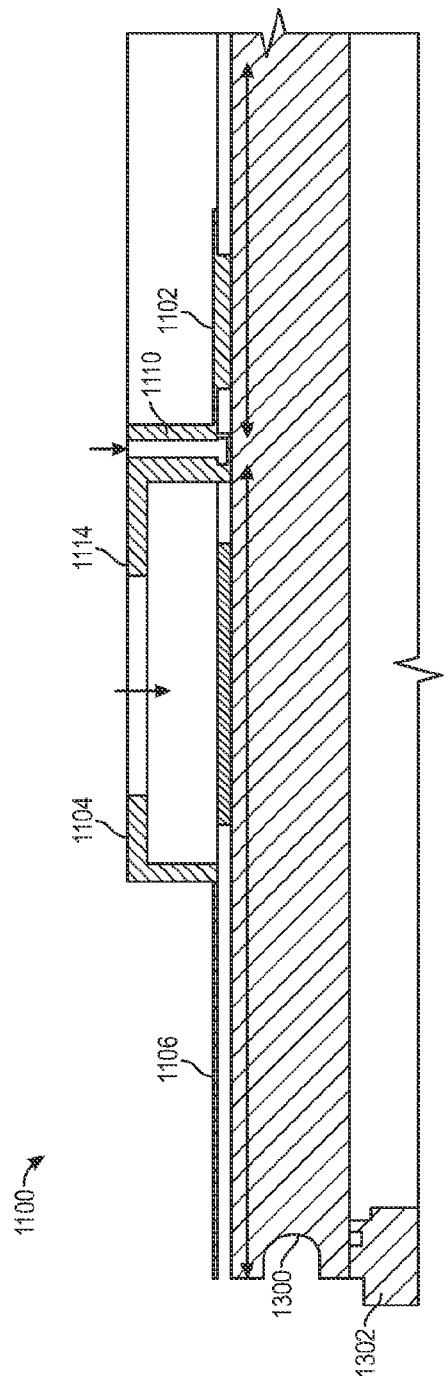
FIG. 13 is a quarter side cross-sectional view of the plenum of FIG. 11 on a dielectric window.

FIG. 13 shows a quarter side cross-sectional view of the plenum 1100 on a dielectric window 1300. The plenum 1100 includes the central recessed area 1102, a middle raised area 1104 and an outer recessed area 1106. The middle raised area 1104 includes the inlet ports (one is shown in FIG. 13). One of the backup passages 1110 is also shown. The dielectric window 1300 is shown on a pinnacle 1302.

Figure 14:
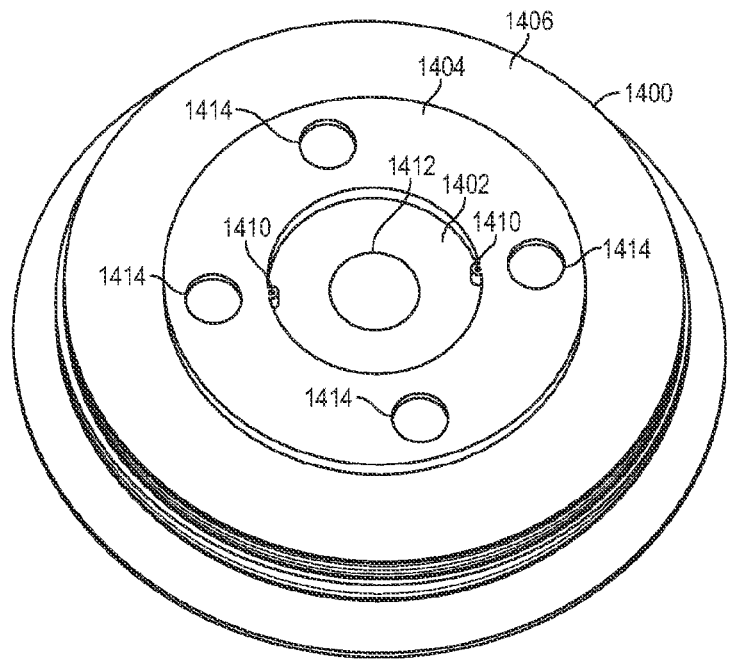
FIG. 14 is a top perspective view of another example plenum having a fourth zonal structure and corresponding fourth flow pattern in accordance with the present disclosure.
Figure 15:
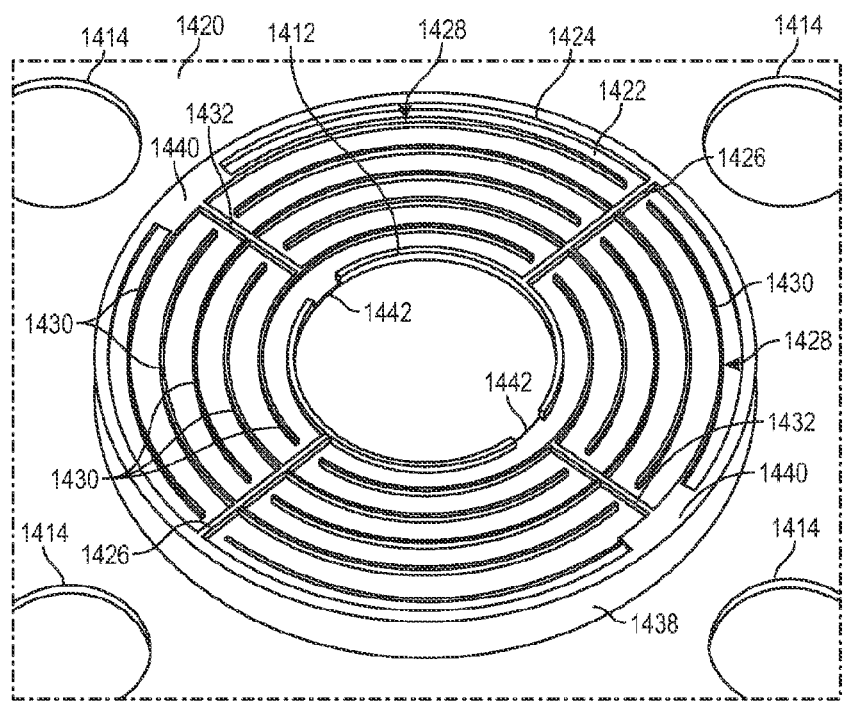
FIG. 15 is a bottom perspective view of the plenum of FIG. 14 on a dielectric window.

FIGS. 14-15 show a plenum 1400 having a fourth zonal structure and corresponding fourth flow pattern. On a top side, the plenum 1400 includes a central recessed area 1402, a middle raised area 1404 and an outer recessed area 1406.

The central recessed area 1402 and the outer recessed area 1406 are configured to hold TCP reactor coils. The central recessed area 1402 includes backup passages 1410 and an output 1412.

The middle raised area 1404 includes inlet ports 1414. The middle raised area 1404 provides a recessed area 1420 on a bottom side of the plenum 1400. On the opposite side of the central recessed area 1402 is a central recessed area 1422 having an outer circular edge 1424 and dividers 1426 providing half sections 1428 with inner annularly extending guides 1430 and radially extending guides 1432. The outer circular edge 1424 is a bottom portion of a side wall 1438 of the central recessed area 1402. The backup passages 1410 have annularly extending output channels 1440 that extend circumferentially along an inner side of the outer circular edge 1424. The annularly extending guides 1430 guide coolant received from the annularly extending output channels 1440 towards the output 1412. The dividers 1426, annularly extending guides 1430 and the radially extending guides 1432 provide channels with outputs 1442 and direct coolant from the annularly extending output channels 1440 to the output 1412.

Figure 16:
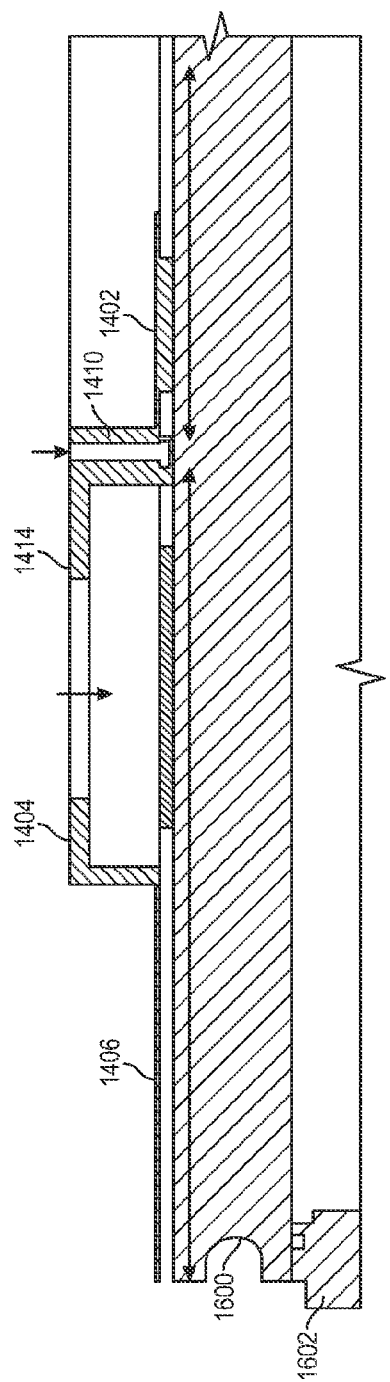
FIG. 16 is a quarter side cross-sectional view of the plenum of FIG. 14.

FIG. 16 shows a quarter side cross-sectional view of the plenum 1400 on a dielectric window 1600. The plenum 1400 includes the central recessed area 1402, a middle raised area 1404 and an outer recessed area 1406. The middle raised area 1404 includes the inlet ports (one is shown in FIG. 16). One of the backup passages 1410 is also shown. The dielectric window 1600 is shown on a pinnacle 1602.

The above-described examples minimize differences in temperatures across a dielectric window. As an example, the embodiment of FIGS. 4-6 may exhibit a maximum difference in temperatures of 8° C. during processing. The maximum difference is between a minimum temperature and a maximum temperature at respective locations on the plenum at any moment in time during processing. This prevents thermal stress on the dielectric window.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A plenum for a dielectric window of a substrate processing system, the plenum comprising:
    a first inlet port;
    a second inlet port; and
    a body comprising
        a first recessed area configured to hold a first coil,
        a second recessed area configured to hold a second coil,
        a third recessed area configured to oppose a first area of the dielectric window, receive a first coolant from the first inlet port, and direct the first coolant across the first area to cool a first portion of the dielectric window, and
        a fourth recessed area configured to oppose a second area of the dielectric window, receive a second coolant from the second inlet port, and direct the second coolant across the second area to cool a second portion of the dielectric window,
    wherein the body comprises a backup passage for cooling at least one of the third recessed area and a fifth recessed area.

2. The plenum of claim 1, wherein the fifth recessed area is configured to oppose a third area of the dielectric window, receive the first coolant from the third recessed area, and direct the first coolant across the third area to cool a third portion of the dielectric window.

3. The plenum of claim 2, wherein the backup passage is disposed in the fifth recessed area and receives a third coolant.

4. The plenum of claim 3, wherein the third coolant is compressed dry air.

5. The plenum of claim 1, wherein:
    the third recessed area is circular shaped and directs the first coolant towards a centrally located output of the plenum; and
    the fourth recessed area is circular shaped and directs the second coolant to an output along a periphery of the plenum.

6. The plenum of claim 1, wherein:
    the first recessed area and the second recessed area are on a top side of the plenum; and
    the third recessed area and the fourth recessed area are on a bottom side of the plenum.

7. The plenum of claim 1, wherein the second recessed area, the third recessed area, and the fourth recessed area are respective channels.

8. The plenum of claim 1, wherein the body is circular shaped.

9. The plenum of claim 1, wherein the body is shaped and sized to match an outer periphery of the dielectric window.

10. The plenum of claim 1, wherein the third recessed area comprises radially extending guides for guiding the first coolant from the first inlet port to a centrally located output.

11. The plenum of claim 1, wherein the third recessed area comprises annularly extending guides for directing the first coolant in an annular direction.

12. The plenum of claim 11, wherein:
    the third recessed area comprises at least one of a divider or a radially extending guide; and
    the annularly extending guides and the at least one of the divider or the radially extending guide direct the first coolant from the first inlet port to a centrally located output.

13. The plenum of claim 1, wherein the first inlet port is configured to receive the first coolant from at least one coolant source and the second inlet port is configured to receive the second coolant from the at least one coolant source.

14. The plenum of claim 13, wherein the first coolant is different than the second coolant.

15. The plenum of claim 13, wherein the first coolant is at least one of at a different flow rate or at a different pressure than the second coolant.

16. The plenum of claim 13, wherein the first coolant is compressed dry air and the second coolant is air at atmospheric pressure.

17. A system comprising:
    the plenum of claim 1;
    the dielectric window; and
    at least one of a valve or a mass flow controller configured to adjust
        at least one of a flow rate or a pressure of the first coolant, and
        at least one of a flow rate or a pressure of the second coolant.

18. A system comprising:
    the plenum of claim 1; and
    the dielectric window,
    wherein
        the third recessed area forms a first channel with the dielectric window, and
        the fourth recessed area forms a second channel with the dielectric window.

19. The system of claim 18, further comprising:
    a temperature sensor detecting a temperature of the dielectric window or a temperature of the plenum; and a controller configured to, based on an output of the temperature sensor, adjust at least one of a flow rate of the first coolant or a flow rate of the second coolant.

20. A plenum for a transformer coupled plasma window, the plenum comprising:
   a first inlet port;
   a second inlet port;
   a backup port; and
   a body comprising
      a circular recessed area configured to hold a first coil,
      a first channel configured to hold a second coil,
      a second channel on an opposite side of the body than the circular recessed area and the first channel, wherein the second channel is configured to oppose a first area of a dielectric window, receive a first coolant from the first inlet port, and direct the first coolant across the first area to cool a first portion of the dielectric window,
      a third channel disposed radially inward of the second channel and on an opposite side of the body than the circular recessed area and the first channel, wherein the third channel is configured to oppose a second area of the dielectric window, receive a second coolant from the second inlet port, and direct the second coolant across the second area to cool a second portion of the dielectric window, and
      a fourth channel disposed radially inward of the third channel and on an opposite side of the body than the circular recessed area and the first channel, wherein the fourth channel is configured to oppose a third area of the dielectric window, receive a third coolant from the backup port, and direct the third coolant across the third area to cool a third portion of the dielectric window.

21. The plenum of claim 20, wherein the third channel is deeper than the fourth channel and directs the second coolant into the fourth channel.

* * * * *